US008514006B2

(12) United States Patent
Cooney et al.

(10) Patent No.: US 8,514,006 B2
(45) Date of Patent: Aug. 20, 2013

(54) OPEN LOOP RAIL-TO-RAIL PRECHARGE BUFFER

(75) Inventors: Padraig Cooney, Somerville, MA (US); Colin Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 71 days.

(21) Appl. No.: 13/115,724

(22) Filed: May 25, 2011

(65) Prior Publication Data

US 2012/0092058 A1    Apr. 19, 2012

Related U.S. Application Data

(60) Provisional application No. 61/393,082, filed on Oct. 14, 2010.

(51) Int. Cl.
*H03L 5/00* (2006.01)
(52) U.S. Cl.
USPC .............................. 327/333; 327/108; 327/109
(58) Field of Classification Search
USPC .......................................... 327/108, 109, 333
See application file for complete search history.

(56) References Cited

U.S. PATENT DOCUMENTS 8,054,110 B2 * 11/2011 Wang et al. .................... 327/109
2011/0084746 A1 * 4/2011 Llewellyn ..................... 327/170

* cited by examiner

*Primary Examiner* — John Poos
(74) *Attorney, Agent, or Firm* — Kenyon & Kenyon LLP

(57) ABSTRACT

A method and system that may include a pair of amplifier transistors and an output coupled to a load device. The precharge buffer may be controlled by an activation signal. The precharge buffer may also include a pair of level shifters. Each level shifter may be provided in association with a respective one of the transistors, and each may provide a respective level shift to an input signal at a common signal source based on a reference voltage. Outputs of the level shifters may be coupled to the respective transistors. The precharge buffer may also include a bypass signal path extending from the common signal source to the load device. A signal path may be controlled by another activation signal, and the precharge buffer and the bypass signal may be enabled during mutually exclusive states of the activation signal.

17 Claims, 6 Drawing Sheets

200

300

400

500

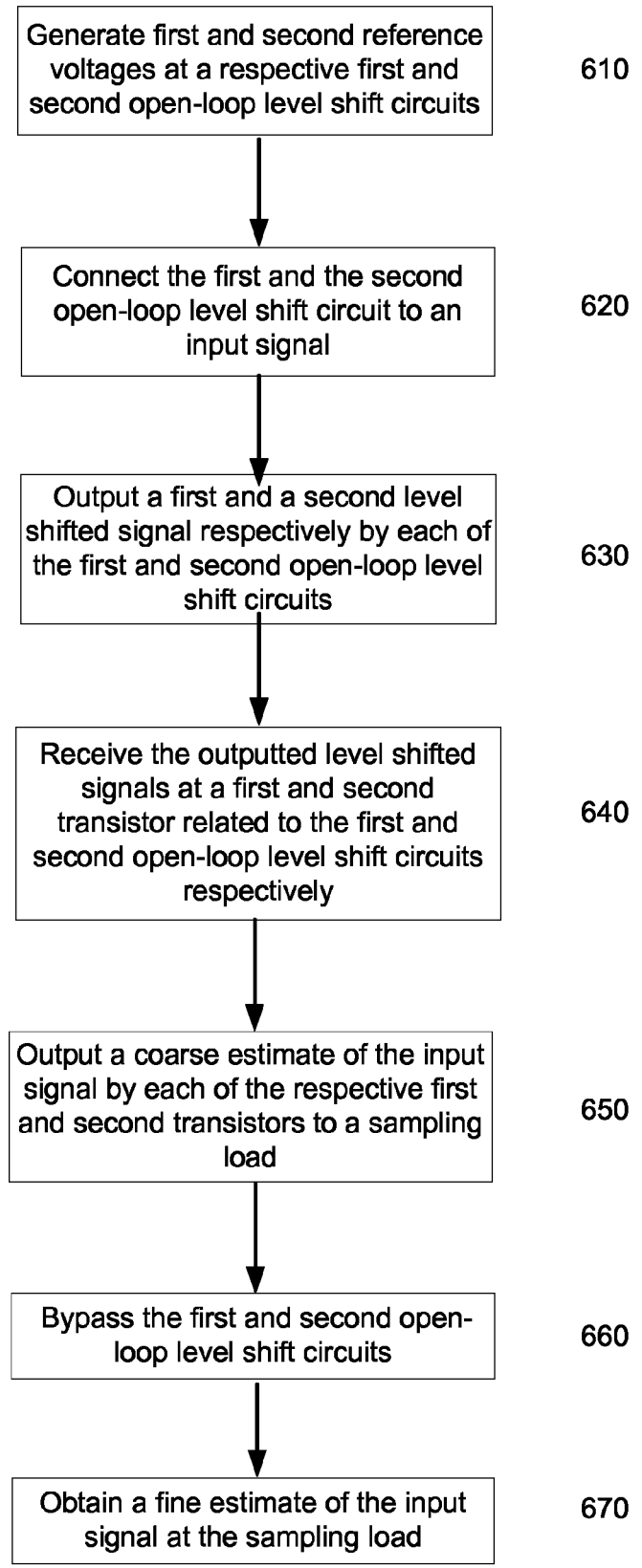

OPEN LOOP RAIL-TO-RAIL PRECHARGE
BUFFER

PRIORITY

This application claims priority to provisional U.S. Patent Application Ser. No. 61/393,082 filed on Oct. 14, 2010, the content of which is incorporated herein in its entirety.

BACKGROUND

The present invention relates to a precharge buffer. In particular, it relates to an open loop buffer design that allows a sampling load to be precharged to an output signal based on an input signal that is at or near either extreme of the rail voltage.

Purely transistor based open loop buffers do not provide good representation of input signals that have a value at or near the positive and negative voltage supplies, which are called the rail voltages, of an amplifier. The configuration of a class AB amplifier is well known as comprising a push-pull stage. The classic class AB push-pull stage comprises a PMOS transistor and an NMOS transistor having a common input to receive an input signal. The push-pull stage is biased by other level shifting transistors which themselves are biased off current sources or resistors. The bias stage therefore cannot accept inputs at the supply extremes due to constraints of the electrical components, such as the transistors and biasing sources. Therefore, the output from a class AB amplifier cannot transition accurately between the positive rail voltage and the negative rail voltage.

Accordingly, there is a need for an amplifier precharger that is open loop (and, therefore, fast responding), provides rail-to-rail voltages, is low noise, low power and has a high input impedance. Such an amplifier precharger would provide for high input impedance sampling that allows for precise sampling of voltages that are at the extremes of the analog power supply rails, in other words, precise sampling of voltages from rail to rail.

BRIEF DESCRIPTION OF THE DRAWINGS

FIG. 6 illustrates an exemplary method for a two-phase sampling of an input signal in a sampling system utilizing an open loop pre-charge buffer according to an embodiment of the present invention.

DETAILED DESCRIPTION

Embodiments of the present invention provide a precharging buffer. The precharging buffer may include a pair of voltage level shifters, an input for receiving a common input signal, outputs and an amplifier including a pair of amplifier transistors. The pair of voltage level shifters may be provided in association with a respective one of the transistors. Each of the voltage level shifters may provide a respective level shift to a common input signal to counteract a threshold voltage of the respective transistor, and may have outputs of the voltage level shifters coupled to the respective transistors.

Another embodiment of the present invention provides a precharge buffer. The precharge buffer may include a pair of amplifier transistors and an output coupled to a load device. The precharge buffer may be controlled by an activation signal. The precharge buffer may also include a pair of level shifters. Each level shifter may be provided in association with a respective one of the transistors, and each may provide a respective level shift to an input signal at a common signal source to counteract a threshold voltage of the respective transistor. Outputs of the level shifters may be coupled to the respective transistors. The precharge buffer may also include a bypass signal path extending from the common signal source to the load device. The bypass signal path may be controlled by the activation signal, and the precharge buffer and the bypass signal may be enabled during mutually exclusive states of the activation signal.

Yet another embodiment provides a method for sampling an input signal. A first open loop level shifter outputs a first level shifted signal. A second open loop level shifter outputs a second level shifted signal. The outputted level shifted signals may be received at a first and second transistor related to the respective first and second open-loop level shift circuits. A coarse estimate of the input signal may be output to a sampling load. The first and second open-loop level shift circuits may be bypassed. In response to bypassing the open-loop level shift circuits, a fine estimate of the input signal at the sampling load may be obtained.

Figure 1:
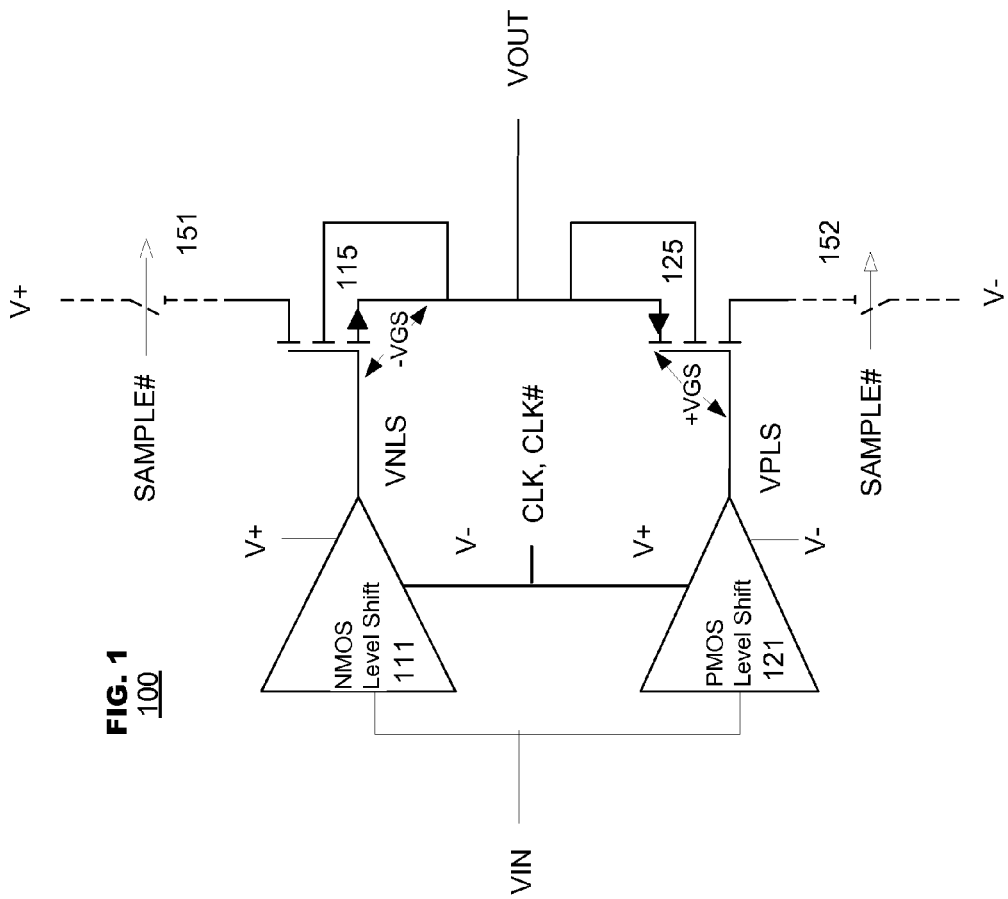
FIG. 1 illustrates a two-stage precharge buffer according to an embodiment of the present invention.

FIG. 1 illustrates a precharge buffer according to an embodiment of the present invention. The precharge buffer 100 comprises an input, an output, a NMOS level shift (NLS) circuit 111, a PMOS level shift (PLS) circuit 121, a PMOS transistor 125, an NMOS transistor 115, and switches 151, 152. The precharge buffer 100 may have inputs for a variable input signal VIN and clock signals CLK, CLK# that may be input into each of the level shift circuits 111, 121. The variable input signal VIN may be an analog signal that transitions in value from either the positive rail voltage (V+) to the negative rail voltage (V−) and vice versa.

The NLS 111 may have an output connected to a gate terminal of transistor 115. A first terminal of switch 151 may be connected to a drain terminal of the NMOS transistor 115 and a second terminal of switch 151 may be connected to a positive rail voltage V+. An output of the PLS 121 may be connected to a gate terminal of the PMOS transistor 125. A first terminal of switch 152 may be connected to a drain terminal of the PMOS transistor 125, and a second terminal of switch 152 may be connected to a negative rail voltage V−. An output of the amplifier 100 may be connected at the common source terminal of NMOS 115 and PMOS 125. The effective output of the amplifier 100 may be the rail-to-rail voltage.

In operation, the NLS 111 may generate a reference voltage Vgs approximately equal to a gate-to-source voltage of the NMOS transistor 115. The NMOS transistor 115 may be selected to have a gate-to-source voltage approximately equal to the generated reference voltage Vgs. Based on timing signals CLK, CLK#, the NLS 111 may connect to a rail-to-rail variable input voltage signal VIN, and output a level shifted output voltage VNLS approximately equal to the input signal VIN plus the reference voltage Vgs. The outputted VNLS will be applied to the gate of NMOS transistor 115, and may have a value exceeding the threshold voltage Vt of the NMOS transistor 115. In effect, the voltage VNLS cancels or counteracts the gate-to-source voltage and the threshold voltage Vt of NMOS transistor 115. The threshold voltage Vt may be the gate voltage at which the NMOS transistor 115 fully conducts. Present at the drain of the NMOS transistor 115 may be a voltage approximately equal to input voltage VIN, which is output from amplifier 100 as output voltage VOUT.

The PLS 121 operates similar to NLS 111. The PLS 121 may generate a reference voltage Vgs approximately equal to a gate-to-source voltage of the PMOS transistor 125. The PMOS transistor 125 may be selected to have a gate-to-source voltage approximately equal to the generated reference voltage Vgs. Based on timing signals CLK, CLK#, the PLS 121 may connect to a variable input signal voltage VIN, and output a level shifted output voltage VPLS approximately equal to the input signal voltage VIN plus the reference voltage Vgs. The outputted level shifted voltage VPLS will be applied to the gate of PMOS transistor 125, and may have a value exceeding the threshold voltage Vt of the PMOS transistor 125. In effect, the voltage VPLS cancels or counteracts the gate-to-source voltage and the threshold voltage Vt of PMOS transistor 125. The threshold voltage Vt may be the gate voltage at which the PMOS transistor 125 fully conducts. At the source of the PMOS transistor 125 may be a voltage approximately equal to input voltage VIN, which is output from precharge buffer 100 as output voltage VOUT.

As illustrated, the output signal VOUT may more closely approximate the value of input signal VIN when it is closer to either of the rail voltages V+ or V−. The precharge buffer can supply large currents and hence may not extend actual acquisition time appreciably compared with non-buffered signal acquisition.

Figure 2:
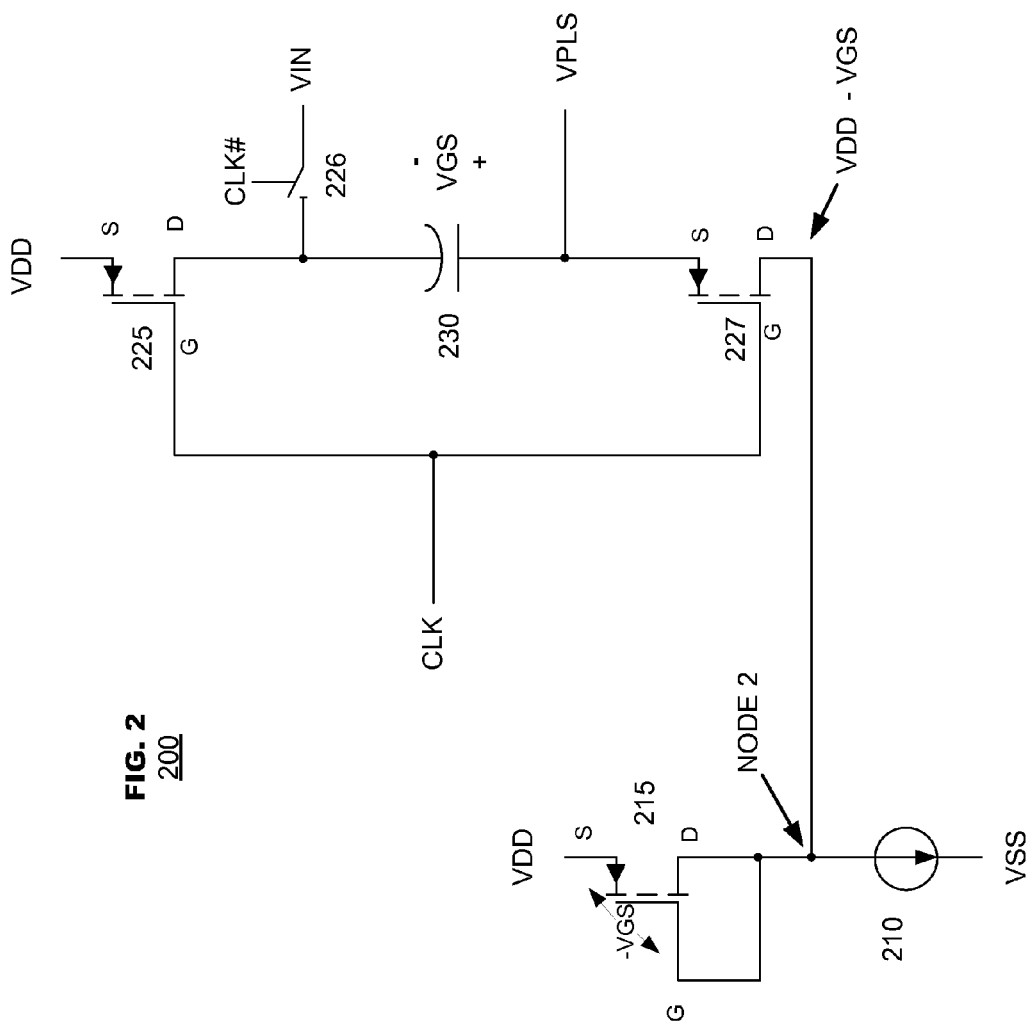
FIG. 2 illustrates a PMOS level shifting circuit according to an embodiment of the present invention.

The output voltage VOUT may give a coarse estimate of the input signal VIN. FIG. 2 illustrates an exemplary configuration of the level shifting circuit PLS 111 according to an embodiment of the present invention.

The PMOS level shifting (PLS) circuit 200 may include PMOS transistors 215, 225 and 227, level shift capacitor 230, switch 226, and a current source device 210. The PMOS transistor 215 may be called a reference transistor because it provides a reference voltage. The PMOS level shifting circuit 200 may have inputs for clock signals CLK and CLK#, an input signal VIN, and power supply voltages VDD(V+) and VSS(V−). The current source device 210 may provide a suitable bias to reference transistor 215. The reference transistor 215 may be configured with a positive voltage source VDD connected to its source terminal, with a feedback loop from the drain terminal to the gate terminal (i.e., diode connected configuration).

The transistor 225 may have a source terminal connected to a power supply voltage VDD(V+), a gate terminal connected to a clock signal CLK, and a drain terminal connected to a first terminal of level shift capacitor 230. The second terminal of level shift capacitor 230 may be connected to the source terminal of transistor 227. The gate terminal of transistor 227 may also be connected to the clock signal CLK. Input signal VIN may be applied to the PMOS level shifting circuit 200 via a switch 226 at the drain of transistor 225 and the first terminal of level shift capacitor 230. A node for outputting output signal VPLS may be at the second terminal of the level shift capacitor 230. In the illustrated example, polarity is defined as the first terminal of level shift capacitor 230 being considered positive.

In operation, a voltage may develop at the gate of reference transistor 215 by operation of the current source 210 due to the feedback connection of the drain to the gate of the reference transistor 215. As reference transistor 215 conducts, a gate-to-source reference voltage Vgs (with respect to ground or VSS) may evolve to a steady state reference voltage Vgs.

As illustrated, the gate-to-source reference voltage Vgs is negative, i.e., −Vgs. The voltage at the drain of reference transistor 215 becomes equal to the sum of the power supply voltage VDD and the negative gate-to-source voltage Vgs (i.e., ≈VDD+(−Vgs)). Thus, a voltage having an approximate value VDD+(−Vgs) may be established at node 2. Since the drain terminal of transistor 227 is connected to node 2, the voltage VDD+(−Vgs) may also be present at the drain of transistor 227. When clock signal CLK is applied low to the gates of transistors 225 and 227, the transistors 225 and 227 may conduct and allow level shift capacitor 230 to charge. On each cycle of the input clock signal CLK, the level shift capacitor 230 charges to a voltage substantially equal to a reference voltage (−Vgs), which in the example may be the negative gate-to-source voltage −Vgs of transistor 215.

A timing signal CLK# may actuate switch 226, in which case the input clock signal CLK ceases to drive the gate terminals of transistors 225 and 227. In this configuration, the input signal VIN is applied to the PLS circuit 200, and the PLS circuit 200 outputs the level-shifted voltage VPLS. The value of level-shifted voltage VPLS may be approximately equal to the sum of the input voltage VIN and the negative reference voltage −Vgs across level shift capacitor 230 (i.e., VPLS≈VIN+(−Vgs).

Conceptually, the operation of a NMOS level shifting circuit is similar to that of the PLS circuit 200. The operation of an exemplary NMOS level shifting circuit will be described in more detail with reference to FIG. 3.

The NMOS level shifting (NLS) circuit 300 comprises NMOS transistors 315, 325 and 327, level shift capacitor 330, switch 326, and a current source device 310. The NMOS transistor 315 may be considered a reference voltage transistor. The NMOS level shifting circuit 300 may have inputs for clock signals CLK and CLK#, and power supply voltage VDD. The circuit 300 may also have an output for output signal VNLS. The current source device 310 may be present to provide a suitable current to bias reference transistor 315. The reference transistor 315 may be configured with a voltage source VDD connected to its drain terminal, a negative-rail voltage source VSS (which may be ground) connected to its source terminal and a circuit path from the drain terminal to the gate terminal (i.e., diode connected configuration). Note that the reference voltage Vgs generated by the NMOS reference transistor 315 may not be the same gate-to-source voltage as the reference voltage generated by the PMOS reference transistor 215.

The NMOS transistor 325 may have a drain terminal connected at node 3, a gate terminal connected to an inverted clock signal CLK#, and a source terminal connected to a first terminal of level shift capacitor 330. The second terminal of level shift capacitor 330 may be connected to the drain terminal of transistor 327. The gate terminal of transistor 327 may be connected to the inverted clock signal CLK#. Input signal VIN may be applied to the NMOS level shifting circuit 300 at the first terminal of level shift capacitor 330. A node for outputting output signal VNLS may be at the second terminal of the level shift capacitor 330.

Figure 3:
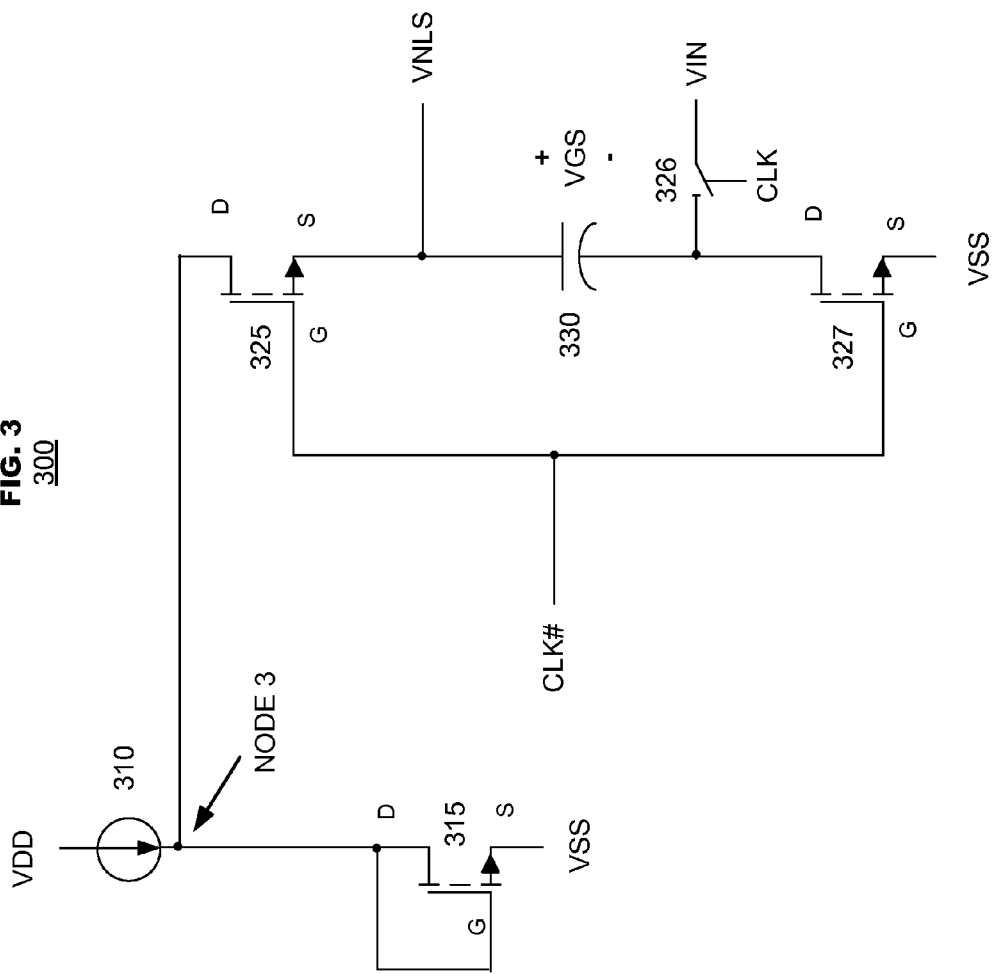
FIG. 3 illustrates a NMOS level shifting circuit according to an embodiment of the present invention.

In operation, a voltage is developed at the gate of reference transistor 315 by operation of the current source 310 at the drain of the reference transistor 315 due to the feedback connection of the drain to the gate of the reference transistor 315. As reference transistor 315 conducts, gate-to-source voltage Vgs evolves to a steady state voltage. In FIG. 3, in which negative supply voltage VSS is shown, the voltage Vgs is a difference potential between the gate and source potentials, and thus the Vgs is independent of the supply voltages. The voltage at node 3 may become approximately equal to the sum of the negative power supply voltage VSS and the gate-to-source voltage Vgs of transistor 315 (i.e., VSS+Vgs). Since the drain terminal of transistor 325 is connected to node 3, the voltage VSS+Vgs may also be present at the drain of transistor 325. The inverted clock signal CLK# may be applied to the gates of NMOS transistors 325 and 327 causing them to conduct, and thereby charge level shift capacitor 330. When CLK# is high the level shift capacitor is charged to the reference Vgs.

A clock signal CLK going high may actuate switch 326, in which case the inverted clock signal CLK# ceases to drive the gate terminals of transistors 325 and 327. With switch 326 closed and the transistors 325 and 327 not conducting, the variable input signal VIN may be acquired by the NMOS level shift circuit 300, and the circuit 300 may output the level-shifted voltage VNLS. The value of level-shifted voltage VNLS may be approximately equal to the sum of the input voltage VIN and the reference voltage Vgs across level shift capacitor 330 (i.e., VNLS≈VIN+Vgs). Additional embodiments comprising level shift circuits 200 and 300 will be described with reference to FIGS. 4-6.

Figure 4:
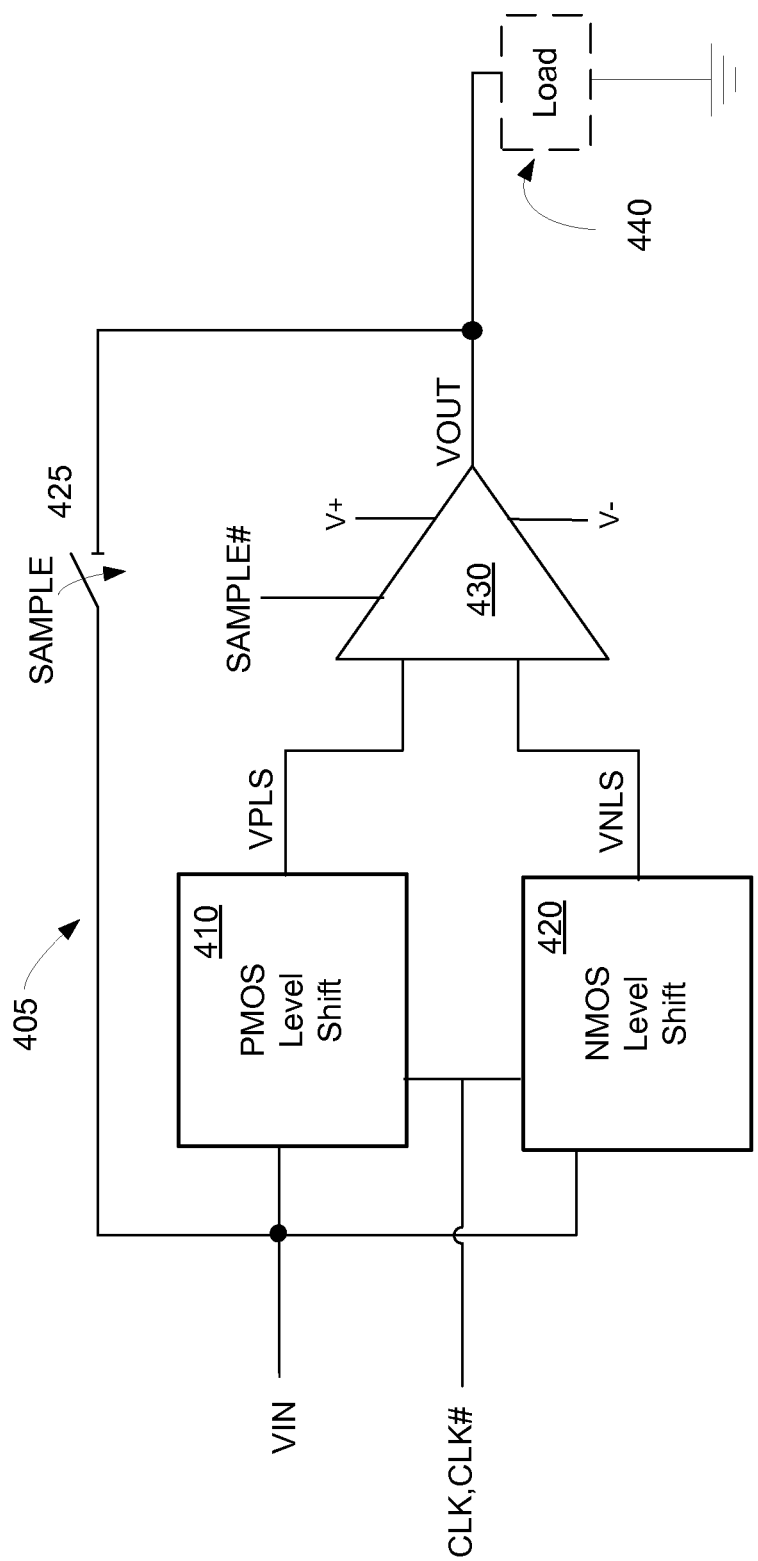
FIG. 4 illustrates an exemplary precharge buffer system according to an embodiment of the present invention.

FIG. 4 illustrates a block diagram of an exemplary precharge buffer system 400 according to an embodiment of the present invention. The precharge buffer system 400 may provide an output signal that closely approximates the input signal allowing for more accurate sampling of the input signal by a sampling load. The precharge buffer system 400 may comprise a PMOS level shifting (PLS) circuit 410, a NMOS level shifting (NLS) circuit 420, an amplifier 430, and a shorting switch 425. The amplifier system 400 may be connected to a sampling load 440, such as an analog-to-digital converter (ADC) or switched capacitor circuit. The amplifier system 400 may also have inputs for an input signal VIN that is to be sampled, and inputs for a clock signal CLK and an inverted clock signal CLK#. The input signal VIN may be input into both the PLS circuit 410 and the NLS circuit 420, and may be applied directly to the sampling load 440 via bypass circuit path 405. The amplifier 430 may have inputs for receiving respective level shifted signals output by the level shift circuits 410, 420, an activation signal (SAMPLE#), and power supply voltages V+ and V−. The output of the amplifier 430 may be an output voltage VOUT that can take any value between V+ and V− as determined by input signal VIN.

Figure 5:
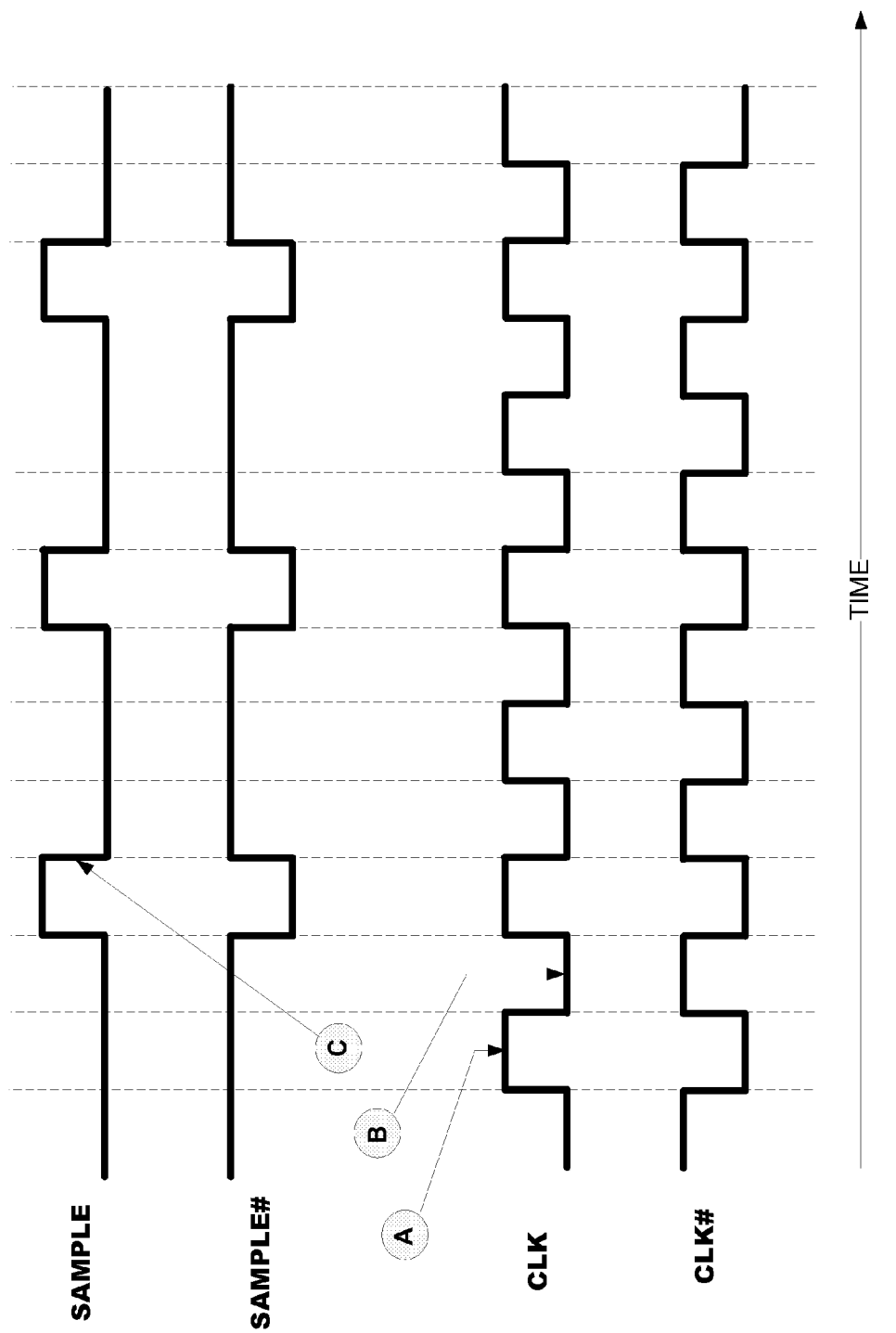
FIG. 5 illustrates an exemplary timing diagram of the signals for implementing a two-phase precharging sampling amplifier according to an embodiment of the present invention.

FIG. 5 is an exemplary timing diagram that illustrates a clock signal CLK, an inverted clock signal CLK#, an SAMPLE signal and a SAMPLE# signal. All timing signals may be derived from the clock signal CLK. As illustrated, the clock signal CLK is twice the frequency of the SAMPLE signal. Note that the timing signals are merely for purposes of illustration and may be any frequency suitable to provide the above described enabling and sampling timing.

A specific example of the timing of the operation of a precharge circuit as shown in FIG. 5 will be made with reference to the precharge circuit of FIG. 4. The clock signals CLK and CLK# may cause the respective level shift circuits to conduct, and the high SAMPLE# signal may enable operation of the amplifier 430. The amplifier system 400 may operate in two phases: a two-stage coarse sampling phase (shown as A and B in FIG. 5) and a fine sampling phase (shown as C in FIG. 5).

At stage A of the two-stage coarse sampling phase, when clock signal CLK is high, the level shift capacitor (e.g., 330 of FIG. 3) of the NMOS level shift circuit 420 may charge to a voltage between reference voltage Vgs and rail voltage VSS. With the clock signal CLK low in stage B, the level shift capacitor is isolated from the reference transistor voltage Vgs, and the input voltage VIN is pushed to the level-shift capacitor at a coarse level because it is open loop. The amplifier 430 may output a voltage VOUT representative of the coarsely sampled input VIN derived from VNLS and VPLS to the capacitive sampling load 440. The output signal VOUT may precharge a capacitor within load 440 to a voltage closely approximating input signal VIN. Conversely, the operation of the PMOS level shift circuit 410 may recharge to the reference voltage Vgs (for example, of reference transistor 215 of FIG. 2) and acquire the input signal according to the inverse clock signal CLK#. The PMOS level shift circuit 410 and the NMOS level shift circuit 420 may deliver a coarse level shifted representation of the analog input signal VIN. In addition, the clock signals CLK and CLK# are shown as non-overlapping to prevent charge from being lost from the level shift capacitors of the level shift circuits 410, 420.

During the fine sampling phase (at C in FIG. 5), the amplifier 430 may be disconnected and a bypass path 405 may be established around both of the level shift circuits 410, 420. The amplifier 430 and switch 425 may operate during opposite states of the SAMPLE signal. In other words, the amplifier 430 and the bypass switch 425 signal may be enabled during mutually exclusive states of the activation signal SAMPLE, thereby closing circuit path 405 between the input signal VIN and sampling load 440. In the fine sampling phase, the amplifier 430 may be disabled, for example, when SAMPLE is high (or on a falling edge of the SAMPLE signal), and the switch 425 is closed. The amplifier 430 may be disabled by removing its connections to the rail voltages V+ and V−. By isolating the pre-charge buffer when circuit path 405 is closed, noise from the pre-charge buffer is prevented being sampled by the sampling load 440 and reduces power dissipation of precharge buffer 400. The sampling load 440 may sample the input signal. The two-phase process provides greater accuracy for the capacitive sampling load 440 and relatively high input impedance. The timing signals illustrated in FIG. 5 are only examples and other timing signals may be utilized to provide the same functions as described above.

Also disclosed is an exemplary method according to another embodiment of the present invention. FIG. 6 illustrates an exemplary method for a two-phase sampling of an input signal in an open loop sampling system according to an embodiment of the present invention. The process 600 may be implemented using the embodiments illustrated in FIGS. 1-4, or in an alternative implementation. At step 610, respective first and second open-loop level shift circuits generate a first reference voltage and a second reference voltage. The respective first and second reference voltages may be generated by transistors as discussed above with respect to FIGS. 2 and 3. The first and the second open-loop level shift circuit may be connected to an input signal, such as input signal VIN discussed in FIGS. 2 and 3. (Step 620). At step 630, each of the first and second open-loop level shift circuits may output a level shifted signal, such as VNLS or VPLS as described above. The outputted level shifted signals may be received at a first and second transistor related to the first and second open-loop level shift circuits respectively. The outputted level shifted signals may be received at a first and second transistor related to the first and second open-loop level shift circuits respectively (step 640). A coarse estimate of the input signal may be, at step 650, output by each of the respective first and second transistors to a sampling load. This may allow the sampling load, which may be a capacitive sampling load, to precharge to an approximate value at the input signal voltage. In a second phase of the operation of the circuit, the first and second open-loop level shift circuits may be bypassed at step 650. So, at step 660, a fine estimate of the input signal at the sampling load may be obtained.

The exemplary embodiments of the precharge buffer provides a high input impedance due to the precharging of the sampling load capacitor. In the absence of the precharge buffer, the sampling load capacitor would typically draw charge at approximately the clock frequency when beginning to charge. However, when the load capacitor is precharged by the precharge buffer, the amount of charge drawn is substantially less, and thereby the load capacitor appears as a high input impedance to the input device.

Several features and aspects of the present invention have been illustrated and described in detail with reference to particular embodiments by way of example only, and not by way of limitation. Those of skill in the art will appreciate that alternative implementations and various modifications to the disclosed embodiments are within the scope and contemplation of the present disclosure.

We claim:

1. A precharge buffer system, comprising:
    an amplifier, comprising a pair of amplifier transistors, and
    a pair of level shifters, each having an output coupled to a control input of a corresponding amplifier transistor, to shift a common input signal by an amount that is substantially equal and opposite to a threshold voltage of the corresponding amplifier transistor to cancel the threshold voltage.

2. The precharge buffer system of claim 1, wherein the amplifier is coupled to power supplies at a pair of rail voltages and the amplifier effective output range is rail-to-rail.

3. The precharge buffer system of claim 1, wherein the amplifier is a class AB amplifier.

4. The precharge buffer system of claim 1, wherein the pair of level shifters are open loop circuits with respect to the amplifier.

5. The precharge buffer system of claim 4, wherein the pair of open loop level shifting circuits comprises:
    an NMOS capacitive level shifter, controlled by a clock signal, for shifting an input signal to a first level-shifted voltage.

6. The precharge buffer system of claim 5, wherein the pair of open loop level shifting circuits comprises:
    a PMOS capacitive level shifter, controlled by a clock signal, for shifting an input signal to a second level-shifted voltage.

7. The precharge buffer system of claim 6, wherein the first level-shifted voltage may be substantially equal to or more positive than a voltage potential of a first power supply and the second level-shifted voltage may be substantially equal to or more negative than a voltage potential of a second power supply.

8. The precharge buffer system of claim 1, further comprising isolation switches for isolating the amplifier from a power supply voltage during a sampling period.

9. The precharge buffer system of claim 1, wherein one of the pair of amplifier transistors comprises an NMOS transistor in which a gate terminal of the NMOS transistor is connected to the output of the NMOS level shifter.

10. The precharge buffer system of claim 1, wherein one of the pair of amplifier transistors comprises a PMOS transistor in which a gate terminal of the PMOS transistor is connected to the output of the PMOS level shifter.

11. The precharge buffer system of claim 1, wherein the pair of amplifier transistors are two transistors of different transistor types connected together at a drain terminal of each of the two different transistors with an output connected between the source terminal of each transistor, and a gate terminal of each of the two different transistor types connected to a separate output of the level shift circuit outputs.

12. A precharge buffer, comprising:
    an amplifier, comprising a pair of amplifier transistors and an output coupled to a load device, the amplifier controlled by an activation signal, and
    a pair of level shifters, each provided in association with a respective one of the transistors, each providing a respective level shift to an input signal at a common input source to counteract a threshold voltage of the respective transistor, outputs of the level shifters coupled to the respective transistors, and
    a bypass signal path extending from the common input source to the load device, the signal path controlled by the activation signal, wherein the amplifier and bypass signal are enabled during mutually exclusive states of the activation signal.

13. The precharge buffer of claim 12, wherein a first capacitive level shifter comprises:
    a first NMOS transistor connected at a drain terminal to a current source, a source terminal connected to a negative supply potential, and a gate terminal connected to the drain terminal;
    a second NMOS transistor connected at a drain terminal to the current source, a source terminal connected to a first terminal of a level-shifting capacitor, and a gate terminal connected to an inverted clock signal; and
    a third NMOS transistor connected at a drain terminal to a second terminal of the level-shifting capacitor, a source terminal connected to the negative supply potential, and a gate terminal connected to an inverted clock signal.

14. The precharge buffer of claim 12, wherein a second capacitive level shifter comprises:
    a first PMOS transistor connected at a source terminal to a voltage source, a drain terminal connected to a current source, and a gate terminal connected to the drain terminal;
    a second PMOS transistor connected at a source terminal to the voltage source, a drain terminal connected to first terminal of a level-shifting capacitor, and a gate terminal connected to a clock signal; and
    a third PMOS transistor connected at a source terminal to a second terminal of the level-shifting capacitor, a drain terminal to the current source, and a gate terminal connected to a clock signal.

15. A pre-charge buffer, comprising:
    inputs for an input signal and a clock signal;
    a class AB amplifier, comprising a pair of amplifier transistors, supplied with power by a positive rail voltage and a negative rail;
    a pair of capacitive level shift circuits, each having an output coupled to a control input of a corresponding amplifier transistor, to shift a common input signal by an amount that is substantially equal and opposite to a threshold voltage of the corresponding amplifier transistor to cancel the threshold voltage; and
    a push-pull output stage having inputs for receiving driving signals from the capacitive level shift circuits, and an output for outputting a signal between rail-to-rail voltages of the class AB amplifier, wherein the driving signal is substantially the same as the input signal.

16. A method for a two-phase sampling of an input signal in an open loop sampling system, comprising:
    connecting a first open-loop level shifter and a second open-loop level shifter to the input signal;
    outputting by the first open-loop level shifter a first level shifted signal;

outputting by the second open-loop level shifter a second level shifted signal;

receiving the outputted first and second level shifted signals at a first and second transistor related to the respective first and second open-loop level shift circuits;

outputting a coarse estimate of the input signal by each of the respective first and second transistors to a sampling load;

bypassing the first and second open-loop level shift circuits; and obtaining a fine estimate of the input signal at the sampling load.

17. The method of claim 16, further comprising:

generating a first and a second reference voltage by a respective first and second open-loop level shift circuit.

* * * * *